(12) United States Patent
Kitahara et al.

(10) Patent No.: US 6,270,203 B1
(45) Date of Patent: *Aug. 7, 2001

(54) MULTILAYER INK JET RECORDING HEAD HAVING A PRESSURE GENERATING UNIT AND A FLOW PATH UNIT

(75) Inventors: Kohei Kitahara; Hideaki Sonehara, both of Nagano-ken (JP)

(73) Assignee: Seiko Epson Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/773,259

(22) Filed: Dec. 23, 1996

Related U.S. Application Data

(60) Continuation of application No. 08/396,775, filed on Mar. 1, 1995, now abandoned, which is a division of application No. 08/110,955, filed on Aug. 24, 1993, now abandoned.

(30) Foreign Application Priority Data

Aug. 26, 1992 (JP) .................................................. 4-227503
Oct. 12, 1992 (JP) .................................................. 4-273149
Dec. 15, 1992 (JP) .................................................. 4-334592
Mar. 15, 1993 (JP) .................................................. 5-80070

(51) Int. Cl.[7] .................................................... B41J 2/045
(52) U.S. Cl. ............................................................. 347/70
(58) Field of Search ............................ 347/68–72; 158/89

(56) References Cited

U.S. PATENT DOCUMENTS 3,747,120 * 7/1973 Stemme ................................. 347/70
3,946,398 * 3/1976 Kyser et al. ........................... 347/70

(List continued on next page.)

FOREIGN PATENT DOCUMENTS 32 08 104 A1 * 9/1983 (DE) .
36 28 346 * 2/1988 (DE) .

(List continued on next page.)

OTHER PUBLICATIONS

Patent Abstracts of Japan, vol. 14, No. 235 (M–0975), May 18, 1990, JP–2–62291 (Toyo Ink Mfg Co Ltd).*
Patent Abstracts of Japan, vol. 10, No. 270 (M–517); Sep. 13, 1986 (JP 61–092863).*

*Primary Examiner*—John Barlow
*Assistant Examiner*—C. Dickens
(74) *Attorney, Agent, or Firm*—Sughrue, Mion, Zinn, Macpeak & Seas, PLLC

(57) ABSTRACT

An ink jet type recording head of a multi-layer structure including a pressure generating unit and a flow path unit. The pressure generating unit is composed of a ceramic vibrating member with piezoelectric transducers on the surface thereof, a ceramic first spacer member with a plurality of through-holes forming pressure chambers, and a lid member having through-holes through which the pressure chambers are communicated with a reservoir, these members being joined by firing in such a manner that a diaphragm is placed on one surface of the first spacer member, and the lid member is sealingly set on the other surface of the spacer member. The flow path unit includes an ink supplying member formed with a metal plate which has through-holes through which the pressure chambers are communicated with nozzle openings and the reservoir is communicated with the pressure chambers, a second spacer member having the reservoir and through-holes through which the pressure chambers are communicated with the nozzle openings, and a nozzle plate member, which members are joined together in such a manner that the ink supplying member is placed on one surface of the second spacer member, and the nozzle plate member is fixedly placed on the other surface of the second spacer member. The outer surface of the lid member is joined to the outer surface of the ink supplying member with a macromolecular adhesive agent.

16 Claims, 8 Drawing Sheets

U.S. PATENT DOCUMENTS

| | | | |
|---|---|---|---|
| 4,014,029 | * | 3/1977 | Lane et al. .............................. 347/47 |
| 4,528,575 | * | 7/1985 | Matsuda et al. ........................ 347/71 |
| 4,680,595 | * | 7/1987 | Cruz-Uribe et al. ................... 347/71 |
| 4,695,854 | * | 9/1987 | Cruz-Uribe ............................ 347/70 |
| 4,730,197 | * | 3/1988 | Raman et al. .......................... 347/70 |
| 4,766,671 | * | 8/1988 | Utsumi et al. ..................... 347/71 X |
| 4,769,654 | * | 9/1988 | Tanaka et al. ......................... 347/40 |
| 4,855,752 | * | 8/1989 | Bergstedt ............................... 347/41 |
| 5,087,930 | * | 2/1992 | Roy et al. .............................. 347/71 |
| 5,126,615 | * | 6/1992 | Takeuchi et al. .................... 310/330 |
| 5,258,774 | * | 11/1993 | Rogers ................................... 347/40 |
| 5,285,215 | * | 2/1994 | Liker ...................................... 347/70 |
| 5,289,209 | * | 2/1994 | Suzuki et al. .......................... 347/71 |
| 5,359,354 | * | 10/1994 | Hiraishi et al. ........................ 347/69 |
| 5,367,324 | * | 11/1994 | Abe et al. .............................. 347/43 |
| 5,463,412 | * | 10/1995 | Matsuda ................................. 347/43 |
| 5,475,279 | * | 12/1995 | Takeuchi et al. .................. 347/70 X |
| 5,489,930 | * | 2/1996 | Anderson ............................... 347/71 |

FOREIGN PATENT DOCUMENTS

| | | | |
|---|---|---|---|
| 0 443 628 | * | 8/1991 | (EP) . |
| 0 554 907 A3 | * | 8/1993 | (EP) . |
| 0 572 230 A2 | * | 12/1993 | (EP) . |
| 0 572 231 A2 | * | 12/1993 | (EP) . |
| 0 584 823 A1 | * | 3/1994 | (EP) . |
| 58-116163 | * | 7/1983 | (JP) . |
| 60-232967 | * | 11/1985 | (JP) . |
| 62-101455 | * | 5/1987 | (JP) . |
| 62-213399 | * | 9/1987 | (JP) . |
| 63-149159 | * | 6/1988 | (JP) . |
| 3-128681 | * | 5/1991 | (JP) . |
| 3-64311 | * | 10/1991 | (JP) . |
| 587366 | * | 1/1993 | (JP) ....................................... 347/71 |
| 5-147210 | * | 6/1993 | (JP) . |
| 5-318735 | * | 12/1993 | (JP) . |
| 8902577 | * | 3/1989 | (WO) ................................... 347/71 |

* cited by examiner

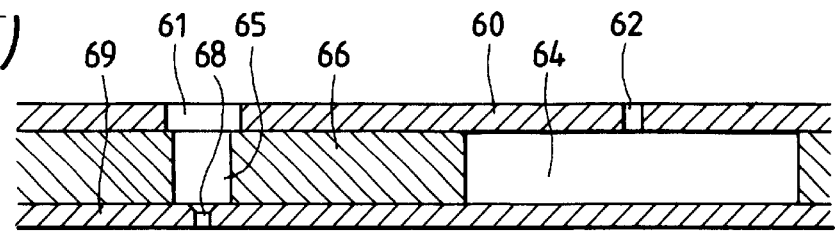
FIG. 10(III)

MULTILAYER INK JET RECORDING HEAD HAVING A PRESSURE GENERATING UNIT AND A FLOW PATH UNIT

This is a continuation of application Ser. No. 08/396,775, filed Mar. 1, 1995, now abandoned which is a divisional of application Ser. No. 08/110,955, filed Aug. 24, 1993 now abandoned.

BACKGROUND OF THE INVENTION

The present invention relates to an ink jet recording head in which piezoelectric transducers provided in parts of pressure chambers communicated with nozzle openings compress the pressure chambers to form ink droplets, and more particularly to an ink jet type recording head which is formed by arranging a nozzle plate, pressure chamber forming members and a vibrating plate one on another, and to a method for manufacturing the ink jet type recording head.

An ink jet type recording head is known in which piezoelectric transducers are coupled to diaphragms which form walls of respective ink pressure chambers, wherein displacement of the piezoelectric transducers varies the volume of the pressure chambers to thereby eject ink droplets. Such a recording head is advantageous in that, since the displacement of the diaphragms by the piezoelectric transducers takes place over a relatively large area of the pressure chambers, ink droplets can be formed stably.

However, the recording head is still disadvantageous in that, since ink droplets are jetted in a direction perpendicular to the direction of displacement of the diaphragm, the recording head is unavoidably large in the direction perpendicular to the surface of the recording sheet, and accordingly the carriage supporting and transporting the recording head and its related components are also unavoidably large in this direction.

In order to overcome the above-described difficulty, an ink jet type recording head has been proposed, for example, in Japanese Unexamined Patent Publication No. Sho. 62-111758, in which pressure generating members including diaphragms and ink flow path forming members are formed in a layered construction, and nozzle openings are provided in a row extending parallel to the direction of displacement of the diaphragm, thereby to reduce the thickness of the recording head. That is, the recording head has a layered structure.

The layered structure is advantageous in that the recording head can be miniaturized, and it can be manufactured using a simple method for joining plate members formed by pressing or etching.

In the manufacturing method for producing the recording head, an adhesive agent is used for joining the plate members. However, during manufacture, the adhesive agent can sometimes flow into small holes which form ink flow paths in the plate members, thus changing the ink flow resistance thereof, lowering the reliability in operation of the recording head. Furthermore, because the piezoelectric transducers must be fixed to the diaphragm with an adhesive agent or by etching or laser welding, the manufacture of the recording head requires much time and labor.

In order to eliminate the above-described difficulties, an ink jet type recording head has been proposed, for example, in Japanese Unexamined Patent Publication No. Sho. 63-149159, which is formed by layering ceramic plates in a semi-solid state, shaped as required to form flow path members, and piezoelectric transducers, one on another and subjecting the structure to firing. That is, the recording head is manufactured without a separate step of mounting the piezoelectric-transducers. However, the method is still disadvantageous in that it cannot achieve a reduction in the thickness of the recording head since the nozzle openings extend in a direction perpendicular to the direction of displacement of the diaphragm, similar to the above-described recording head.

SUMMARY OF THE INVENTION

In view of the foregoing, an object of the invention is to provide an ink jet type recording head in which the manufacturing assembly accuracy is improved, the number of steps required for joining the relevant members is minimized, and the nozzle openings are provided in parallel with the direction of displacement of the diaphragms to reduce the thickness of the recording head.

Another object of the invention is provide a method for manufacturing such an ink jet type recording head.

In order to achieve the aforementioned objects of the invention, a multi-layer ink jet type recording head is manufactured according to the invention as follows: A first plate member of ceramic forming a vibrating member with piezoelectric transducers on the surface thereof, a first spacer member made of ceramic with a plurality of through-holes therein forming pressure chambers, and a lid member having through-holes through which the pressure chambers are communicated with a reservoir and are joined together to form a pressure generating unit in such a manner that the first plate member is placed on one surface of the first spacer member, and the lid member is sealingly set on the other surface of the spacer member. An ink supplying member made of a metal plate and which is connected through a flow path to an ink tank and has through-holes through which the pressure chambers are communicated with nozzle openings and the reservoir is communicated with the pressure chambers, a second spacer member having through-holes through which the pressure chambers are communicated with the reservoir and the nozzle openings, and a nozzle plate member with the nozzle openings formed therein are joined together to form a flow path unit in such a manner that the ink supplying member is placed on one surface of the second spacer member, and the nozzle plate member is fixedly placed on the other surface of the second spacer member. The outer surface of the lid member in the pressure generating unit is joined to the outer surface of the ink supplying member in the flow path unit with a macromolecular adhesive agent.

In the pressure generating unit, which is made of ceramic, small through-holes are formed in the spacer member, which simplifies the manufacturing step of joining the vibrating member, the spacer member and the lid member, and positively prevents leakage of ink past the unit, to which high pressure is exerted. The flow path unit, which is made of metal, has a relatively large through-hole to form the reservoir in the space member, and therefore it is high in dimensional accuracy. The pressure generating unit and the flow path unit are joined together with a macromolecular adhesive layer, so that the difference in thermal expansion between the two units, which are made of different materials as described above, can be absorbed.

DESCRIPTION OF THE PREFERRED EMBODIMENTS

Preferred embodiments of the invention will now be described with reference to the accompanying drawings.

Figure 1:
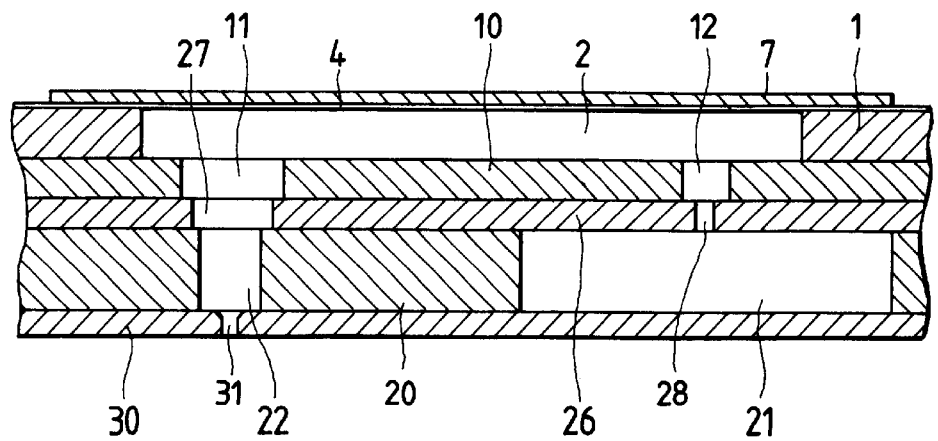
FIG. 1 is a sectional view showing a multi-layer type ink jet type recording head constructed in accordance with a preferred embodiment of the invention.
Figure 3:
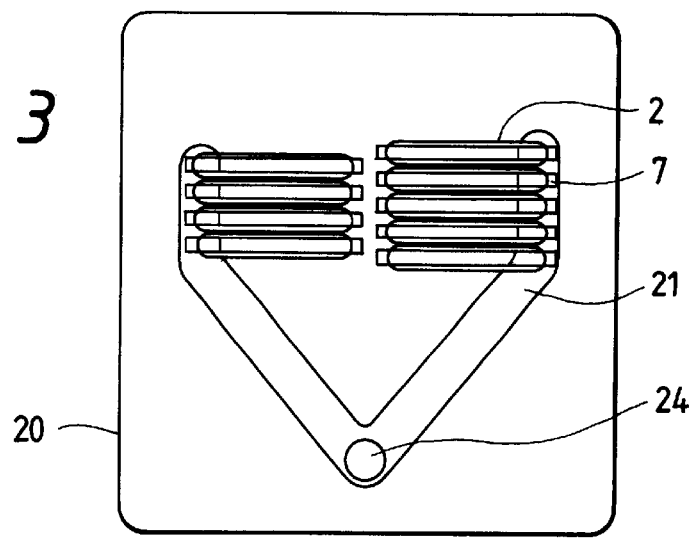
FIG. 3 is an explanatory diagram showing the positional relationships between pressure chambers in the recording head.
Figure 2:
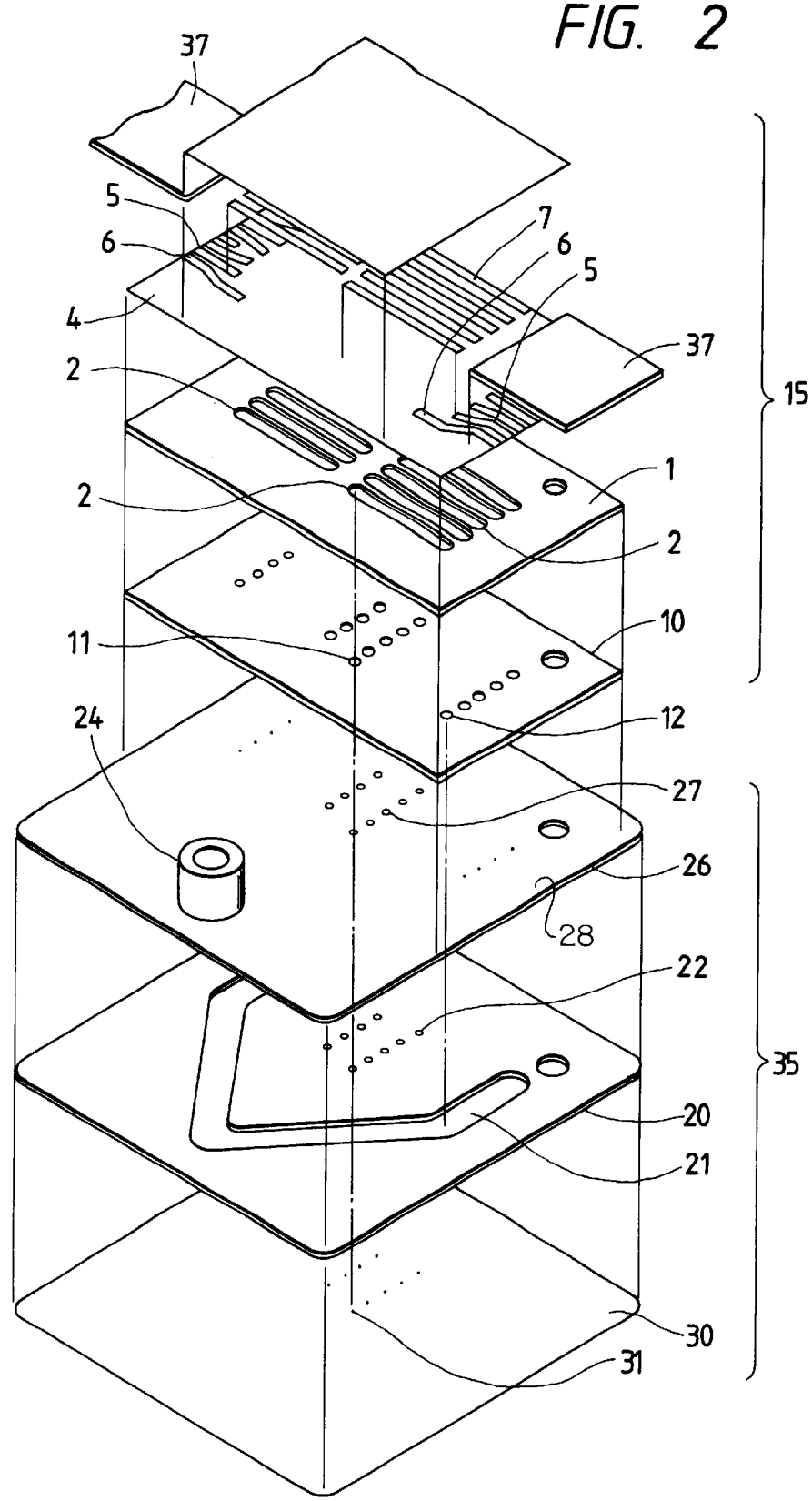
FIG. 2 is an exploded perspective view of the recording head shown in FIG. 1.
Figure 5:
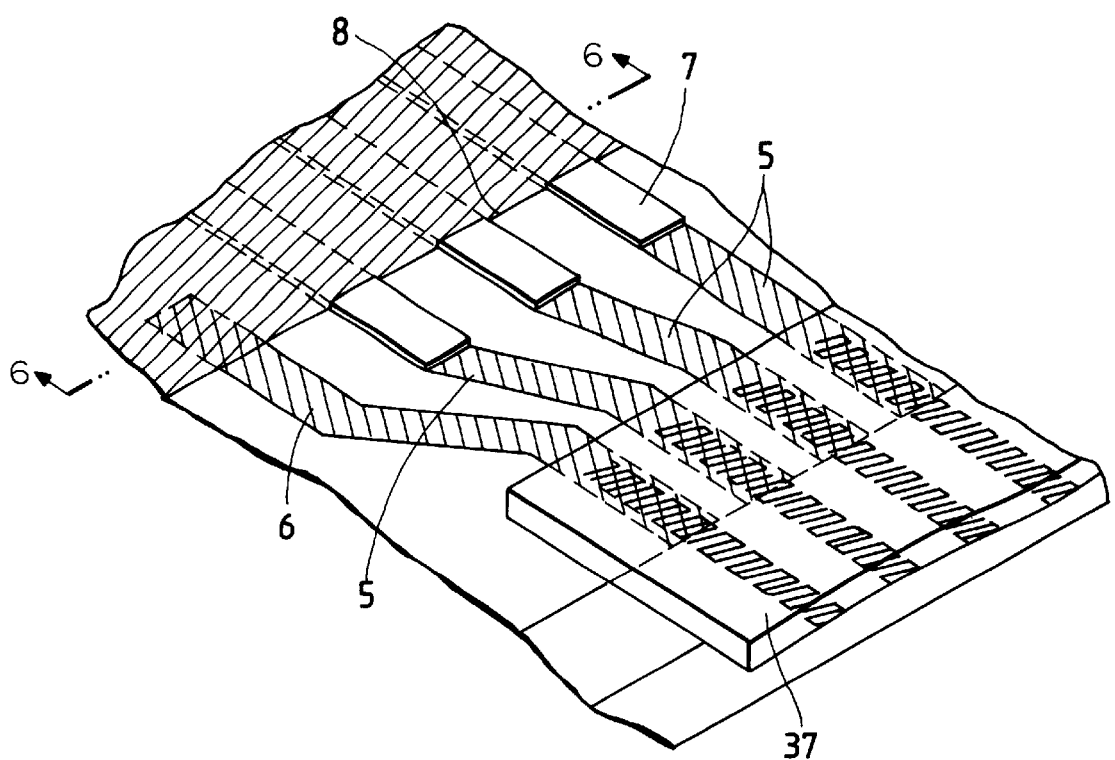
FIG. 5 is a perspective view showing the positional relationships between piezoelectric transducers and electrodes in the recording head.

FIGS. 1 and 2 are respectively a cross-sectional view and an exploded perspective view showing a preferred embodiment of a multi-layer ink jet recording head constructed in accordance with the invention. In these figures, reference numeral 1 designates a spacer member made of a ceramic plate of zirconia ($ZrO_2$) or the like having a thickness of 150 $\mu$m. The spacer member 1 has a number of elongated holes 2 formed at predetermined intervals therein, thus forming pressure chambers. Each of the elongated holes 2 has one end portion located over a reservoir 21 as shown in FIG. 3, and the other end portion located over a nozzle opening 31. A diaphragm 4 is fixedly mounted on one surface of the spacer member 1. The diaphragm 4 is made of a material which, when fired together with the spacer member 1, is compatible in characteristics with the latter, and it has a high elastic modulus. In this embodiment, the diaphragm 4 is made of a thin zirconia plate 10 $\mu$m in thickness, similar to the spacer member. As shown in FIG. 5, on the surface of the diaphragm 4, electrodes 5 for applying drive signals to piezoelectric transducers 7 are provided in correspondence to the pressure chambers 2, and lead-out electrodes 6 of a common electrode (described below) are provided.

Figure 4:
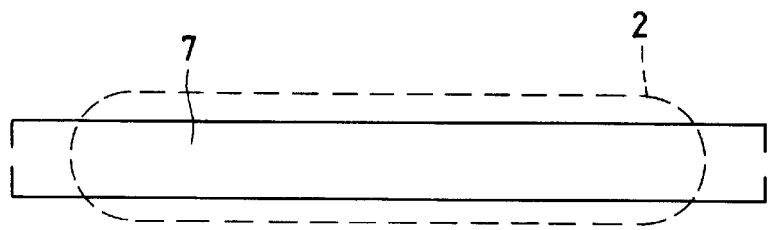
FIG. 4 is an explanatory diagram showing the position of a piezoelectric transducer in the recording head.
Figure 6:
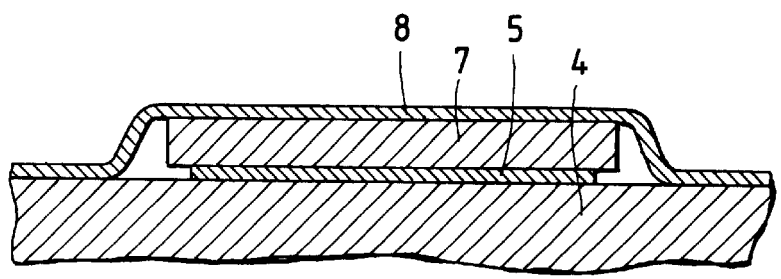
FIG. 6 is a sectional view taken along a line A—A in FIG. 5 showing the structure of the piezoelectric transducer mounted on a diaphragm in the recording head.

The piezoelectric transducers 7 cover the drive signal applying electrodes 5. More specifically, each of the transducers 7 is made of a thin plate of piezoelectric vibrating material such as PZT, which is substantially equal in length to the pressure chamber 2 but smaller in width than the latter, as shown in FIG. 4. That is, the transducer 7 is designed so that it flexes in such a manner as to curve in the direction of width with the longitudinal direction as an axis. As shown in FIGS. 5 and 6, the aforementioned common electrode 8 is formed on the piezoelectric transducers 7 and the lead-out electrodes 6, for instance, by sputtering. That is, the lower surface (on the side of the diaphragm 4) of each piezoelectric transducer 7 is connected to the drive signal applying electrode 5, and the upper surface is connected to the common electrode 8.

Further in FIGS. 1 and 2, reference numeral 10 designates a lid member which, together with the diaphragm 4, forms the pressure chambers 2. The lid member 10 is made of a material which, when fired together with the spacer member 1, is compatible in characteristics with the latter. In this embodiment, it is made of a thin zirconia plate 150 $\mu$m in thickness. The lid member 10 has through-holes 11 through which the nozzles openings 31 are communicated with the pressure chambers 2, and through-holes 12 through which the reservoir 21 is communicated with the pressure chambers 2.

The above-described members 1, 4 and 10 are fixedly combined together, thus forming a pressure generating unit 15.

Reference numeral 20 designates a spacer member forming a flow path unit 35. The spacer member 20 is made of a corrosion-resistant plate such as a stainless steel plate 150 $\mu$m in thickness and which is suitable for formation of ink flow paths. The spacer member 20 has a substantially V-shaped through-hole forming the aforementioned reservoir 21, and through-holes 22 through which the pressure chambers 2 are communicated with the nozzle openings 31. The through-hole forming the reservoir 21 extends radially of an ink supplying inlet member 24 and then parallel to the ends of the pressure chambers 2. More specifically, in the embodiment having the nozzle openings in two lines, the through-hole forming the reservoir 21 includes a V-shaped portion extending radially outward of the ink supplying inlet member 24, and two parallel portions extending from the two outer ends of the V-shaped portion along the ends of the pressure chambers 2.

Reference numeral 26 designates an ink supplying member fixed to one surface of the above-described spacer member 20.

The ink supplying member 26 has through-holes 27 through which the pressure chambers 2 are communicated with the nozzle openings 31, and a through-holes 28 through which the reservoir 21 is communicated with the pressure chambers 2. The ink supplying member 26 further has the ink supplying inlet member 24 on its surface, which is connected to an ink tank (not shown).

Reference numeral 30 designates a nozzle plate fixed to the other surface of the spacer member 20. The nozzle plate 30 is made of a stainless steel plate 60 $\mu$m in thickness and which is suitable for formation of nozzle openings 40 $\mu$m in diameter. The nozzle openings 31 in the nozzle plate 30 are formed in correspondence with the pressure chambers 2.

The members 20, 26 and 30 are stacked one on another and fixed together as a unit using an adhesive or by welding using diffusion between metals, thereby to form the aforementioned flow path unit 35. In this operation, the stacking of the members is performed under a high pressure; however, they can be accurately stacked one on another without intrusion or deformation although the large through-hole for forming the reservoir 21 is within in the stack because the members are made of metal, as described above.

The pressure generating unit 15 and the flow path unit 35 are joined through their confronting surfaces, namely, the contact surfaces of the lid member 10 and the ink supplying member 26, with an adhesive, thereby to form the recording head.

Thus, the pressure chambers 2 are communicated through the through-holes 12 of the lid member 10 and the through-holes 28 of the ink supplying member 26 with the reservoir 21, and they are further communicated through the through-holes 11 of the lid member 10, the through-holes 27 of the ink supplying member 26 and the through-holes 22 of the spacer member 20 with the nozzle openings 31.

Figure 7:
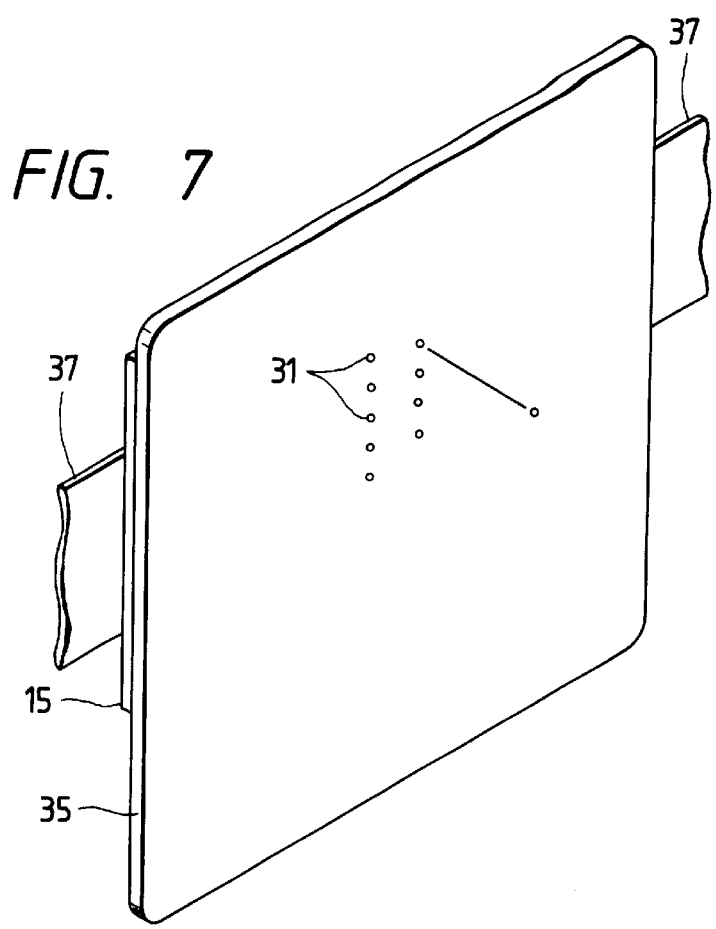
FIG. 7 is a perspective view outlining the recording head.
Figure 8:
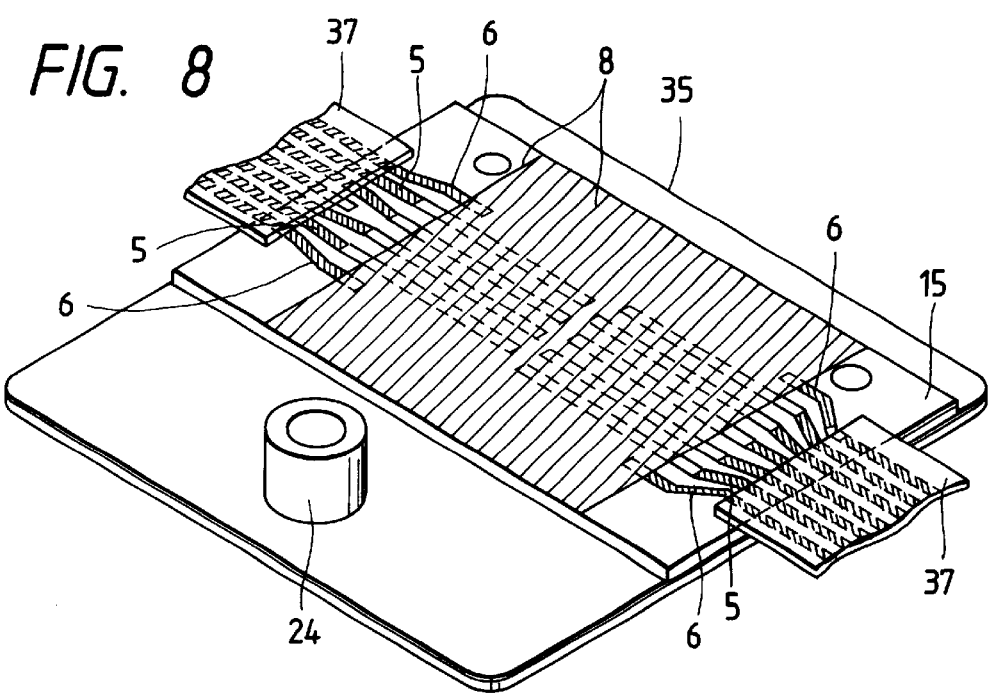
FIG. 8 is a perspective view showing the rear structure of the recording head.

FIGS. 7 and 8 show the front and rear structures of the multi-layer ink jet type recording head according to the invention. In the front structure, the nozzle openings are arranged in two lines at predetermined intervals. In the rear structure, the pressure generating unit 25 is fixedly secured to the flow path unit 35, and cables 37 are provided for applying electrical signals to the piezoelectric transducers 7.

Figure 9A:
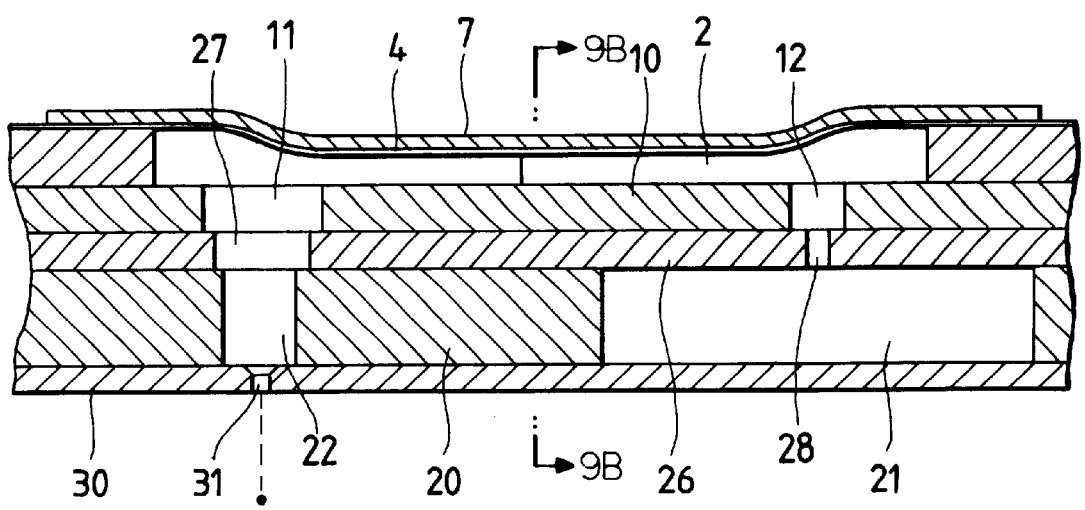
FIGS. 9(a) and 9(b) are, respectively, a longitudinal sectional view and a cross-sectional view taken along a line B—B in in FIG. 9(a) showing the recording head jetting an ink droplet.
Figure 9B:
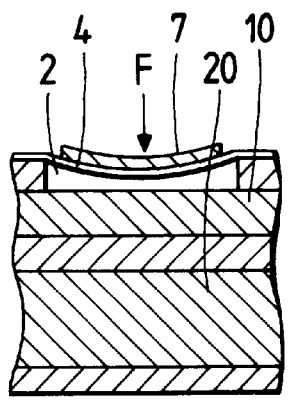

When a drive signal is applied to any one of the piezoelectric transducers 7, the respective transducer 7 is flexed in the direction of width with the longitudinal direction as an axis, thus deforming the diaphragm 7 towards the pressure chamber as shown in FIG. 9. As a result, the volume of the corresponding pressure chamber 2 is decreased; that is, pressure is applied to the ink in the pressure chamber. Hence, the ink in the pressure chamber 2 is forced to move through the corresponding through-hole 11 of the lid member 10, the through-hole 27 of the ink supplying member 26 and the through-hole 22 of the spacer member 20 in the flow path unit 35 into the nozzle opening 31, from which it is jetted in the form of an ink droplet.

The ink flow paths extending from the pressure chambers 2 to the nozzle openings 31 are defined by the through-holes 11, 27 and 22, which are formed in the lid member 10, the ink supplying member 26 and the spacer member 20, respectively. The through-holes 11, 27 and 22 are reduced in diameter in the stated order, which substantially prevents the air from from entering into the pressure chamber through the ink flow path even when the meniscus of the ink in the nozzle is destroyed and drawn toward the pressure chamber. The ink in the pressure chamber 2 may flow through the through-holes 12 and 28 into the reservoir 21; however, since the through-hole 28 is small in diameter, this flow of ink will not greatly reduce the pressure; that is, it will not adversely affect the jetting of the ink droplet.

When the application of the drive signal is suspended, that is, when the piezoelectric transducer 7 is restored to its unexcited state, the volume of the pressure chamber 2 is increased so that a negative pressure is formed in the pressure chamber 2. As a result, the same amount of ink as previously consumed is supplied from the reservoir 21 through the through-holes 28 and 12 into the pressure chamber 2. The negative pressure in the pressure chamber 2 acts on the nozzle opening 31; however, the meniscus in the nozzle openings prevents the ink from returning towards the pressure chambers. Therefore, the negative pressure is effective in sucking the ink from the reservoir 21.

The flow path unit 35 is connected to the pressure generating unit 15 through a thick layer of macromolecular adhesive about 30 µm in thickness. Therefore, even if, when the ambient temperature changes, the two units 35 and 15 are urged to shift relative to each other because of a difference in thermal expansion, the shift is absorbed by the layer of macromolecular adhesive, so that the nozzle plate is prevented from being bent; that is, the layer of macromolecular adhesive prevents the formation of prints low in quality.

Figure 10I:
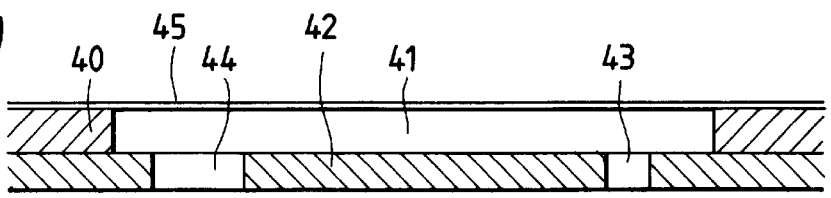
FIGS. 10(I)–10(V) are sectional views for a description of a method for manufacturing a multi-layer type ink jet type recording head according to the invention.
Figure 10:
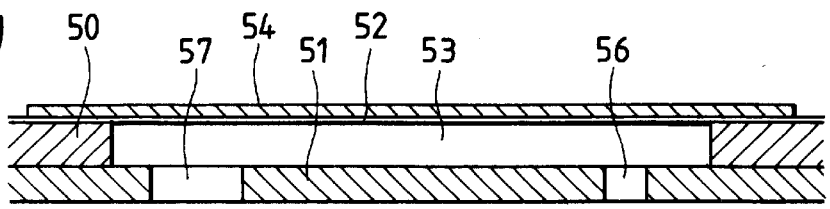
Figure 10:
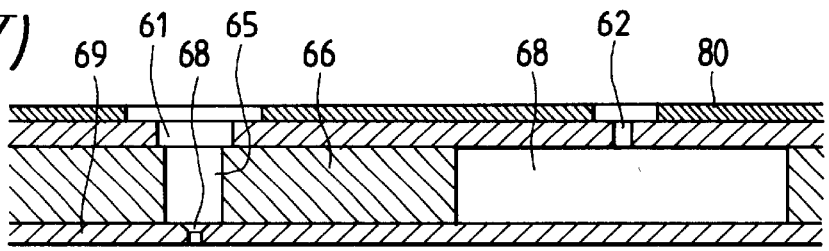

A method for manufacturing the above-described recording head now will be described with reference to FIG. 10.

A ceramic material having a thickness suitable for formation of the pressure chambers 2 by firing is prepared. In the present embodiment, a thin plate of zirconia having a clay-like consistency, namely, "a green sheet" is used for formation of a first sheet 40. A press is used to form through-holes 41 in the green sheet at the positions where the pressure chambers 2 are to be formed. Similarly as in the case of the first sheet, a second sheet 42 is machined on the press. That is, through-holes 43 and 44 through which the reservoir 21 is communicated with the nozzle openings 31 are formed in a green sheet of zirconia having a thickness suitable for formation of the lid member 10.

The first sheet 40 is set on the second sheet 42, and a third sheet 45 is placed on the first sheet 40, which is made of a green sheet of zirconia having a thickness suitable for formation of the diaphragm 4. The three sheets 40, 42 and 45 are joined to one another under uniform pressure, and then dried. In this drying step, the three sheets 40, 42 and 45 are temporarily bonded together and semi-solidified. The assembly of these sheets is fired at a predetermined temperature, for instance 1000° C., while the assembly is pressurized to the extent that the assembly is prevented from bending. As a result, the sheets are transformed into ceramic plates, the interfaces of which are combined together by firing. That is, they are formed into an integral unit.

As described above, the through-holes 41 forming the pressure chambers are formed in the first sheet 40. The through-holes 41 are extremely small in width. Hence, when the three sheets are temporarily bonded together, the second and third sheets 42 and 45 (which form the lid member and the diaphragm, respectively) are not deformed, and the pressure is suitably concentrated at the through-holes 41, which contributes to the combining of the second and third sheets 42 and 45 with the first sheet 40 by firing. Thus, the volume of each pressure chamber can be set as required.

The first, second and third sheets 40, 42 and 45 thus fired function as a spacer member 50, a lid member 51 and a diaphragm 52, respectively. In this state, electrically conductive paste layers are formed on the surface of the diaphragm 52 at the positions of the pressure chambers 53 and of the common electrode lead-out terminals by a thick film printing method. Relatively thick layers of piezoelectric materials of a clay-like consistency namely a "green sheet" are formed with a mask by printing so as to provide through-holes in correspondence to the pressure chambers 53. Thus, the method includes bonding the piezoelectric material to the signal applying electrodes. When the thick layers have been dried to the extent that they are suitable for firing the transducer-forming materials, the whole assembly is heated at a temperature suitable for firing the piezoelectric transducers and the electrodes, for instance, in a range of from 1000° C. to 1200° C. Thus, the piezoelectric transducers 54 are formed for the respective pressure chambers 53 (see FIG. 10 (II)).

Thereafter, a layer of electrically conductive material is formed over the common electrode lead-out terminals and the piezoelectric transducers 54 by a thin film forming method such as a sputtering method. Thus, the pressure generating unit is formed, which appears as if it were made of a single component although it includes the diaphragm, the spacer member and the lid member.

Figure 11:
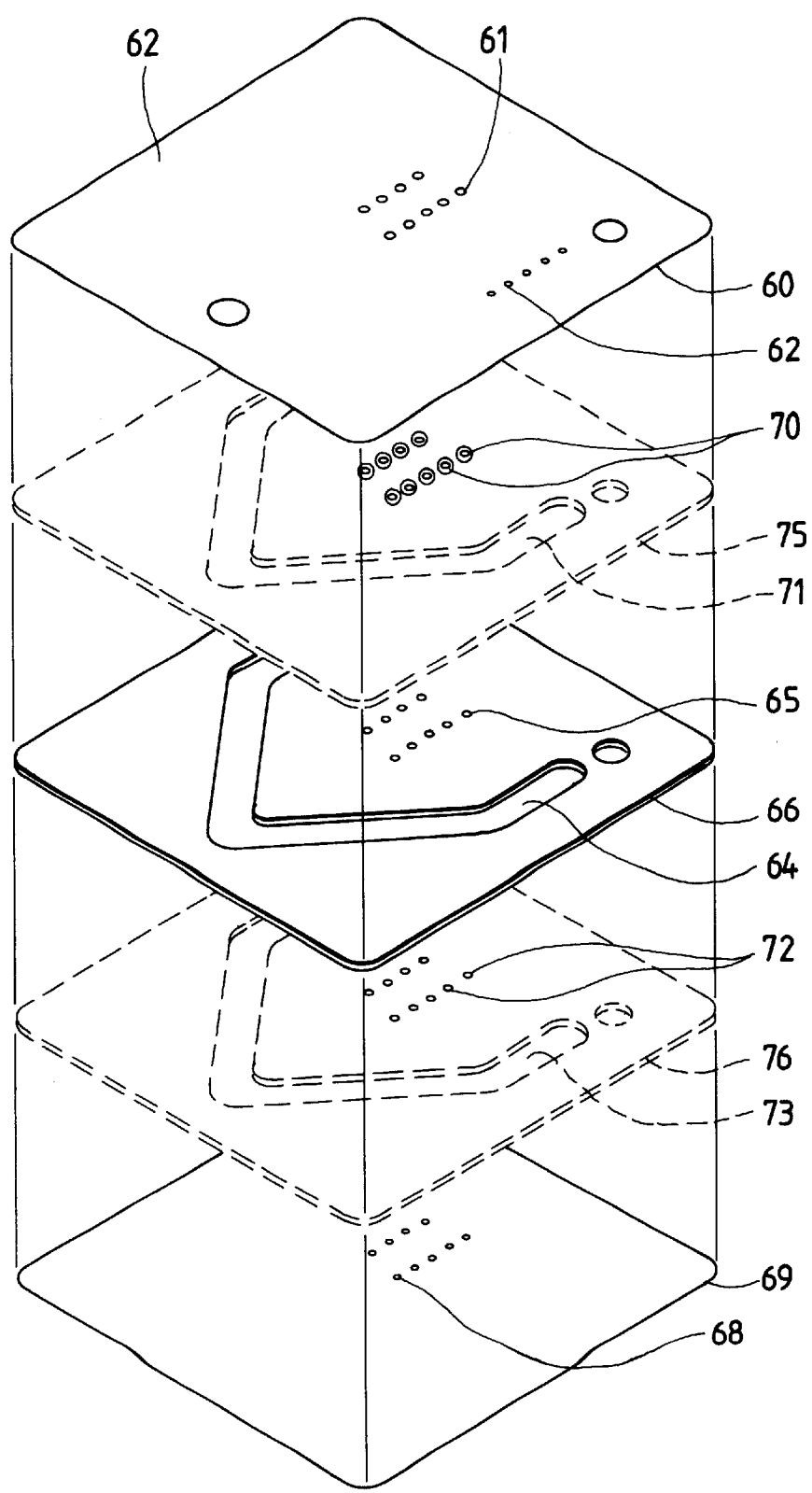
FIG. 11 is an exploded view for a description of a step of joining plates together to form a flow path unit.

On the other hand, an ink supplying member 60, a reservoir forming member 66, and a nozzle plate member 69 are prepared using metal plates having respective predetermined thicknesses. That is, the ink supplying member 60 is formed by forming through-holes 61 and 62, which correspond to the through-holes 27 and the flow path regulating holes 28, in the metal plate on the press. The reservoir forming member 66 is formed by cutting through-holes 64 and 65, which correspond to the reservoir 21 and the through-holes 22, in the metal plate on the press. The nozzle plate member 69 is also formed by forming through-holes 68, which correspond to the nozzle openings 32, in the metal plate on the press. As shown in FIG. 11, a bonding film 75 having through-holes 70 and a through-hole 71 is inserted between the members 60 and 66, while a bonding film 76 having through-holes 72 and a through-hole 73 is inserted between the members 66 and 69. In this connection, it should be noted that the through-holes 70, 71, 72 and 73 are formed in the bonding films 75 and 76 in such a manner that the remaining portions of the films 75 and 76, namely, the bonding regions thereof, do not cover the through-holes 61, 62, 64, 65 and 68 of the members 60, 66 and 69. The members 60, 64 and 69 and the films 75 and 76, which have been stacked in the above-described manner, are thermally bonded under pressure to form the flow path unit.

Figure 10V:
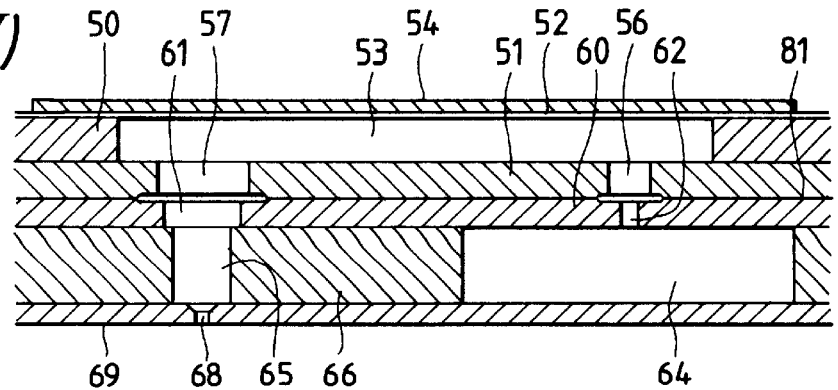
Figure 12A:
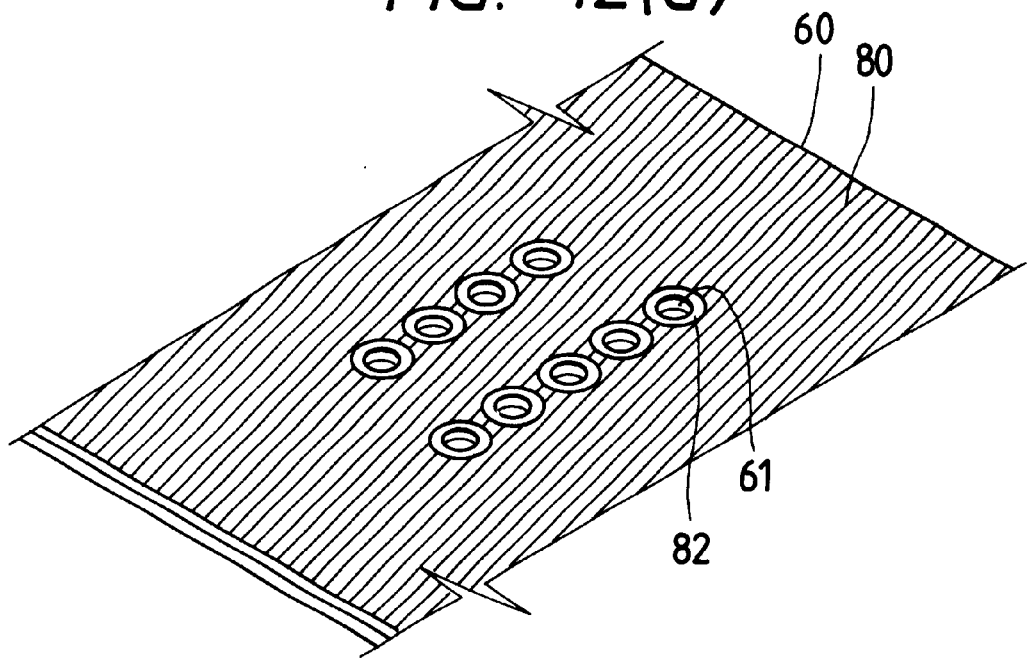
FIGS. 12(a) and 12(b) are diagrams showing an adhesive layer through which the flow path unit is joined to a pressure generating unit.
Figure 12B:
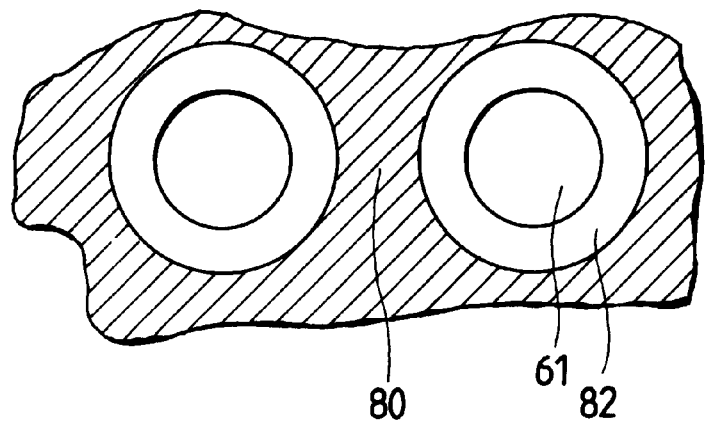

The pressure generating unit and the flow path unit are joined as follows: As shown in FIG. 12(a), an adhesive layer 80 is formed on the surface of one of the units, for instance, the surface of the ink supplying member 60, by coating it with adhesive or by using a thermal welding film (see FIG. 10(IV)), and the lid member 51 of the pressure generating unit is placed on the adhesive layer 80 thus formed in such a manner that the through-holes 56 and 57 are coaxial with the through-holes 62 and 61 (FIG. 10(V)). The through-holes 57, 61 and 65 are arranged to have sequentially reduced diameter. As a result, an adhesive layer 81 is formed between the flow path unit and the pressure generating unit, which serves as a cushion member to absorb the difference in thermal expansion between the two members. The adhesive layer 80 spreads outward when squeezed between the two units. As shown in FIG. 12, there are provided regions 82 around the through-holes where no adhesive is provided, thereby to prevent the adhesive from spreading into the through-holes of the lid member 51 and the ink supplying member 60.

In the recording head of the invention, the pressure generating unit is made of ceramic, which has a lower density than metal, and therefore vibration propagating between adjacent piezoelectric transducers is greatly attenuated; that is, crosstalk is prevented. Furthermore, the elements forming the vibrating portion of the recording head of the invention are joined as an integral unit without the intrusion of any foreign member. This feature positively eliminates the difficulty of ink leaking because of inadequate adhesion.

Furthermore, in the recording head of the invention, the base of the pressure generating unit and the ceramics forming the vibration generating unit are fired at temperatures suitable therefor. Thus, the operation of the recording head is high in reliability As described above, the multi-layer ink jet type recording head of the invention comprises the pressure generating unit and the flow path unit. The pressure generating unit includes the first plate member of ceramics forming the vibrating member with the piezoelectric transducers on the surface thereof, the first spacer member of ceramics with the through-holes forming the pressure chambers, and the lid member having the through-holes through which the pressure chambers are communicated with the reservoir, which members are joined in such a manner that the first plate member is placed on one surface of the first spacer member, and the lid member is sealingly set on the other surface of the spacer member. The flow path unit includes the ink supplying member made of a metal plate which is connected through the flow path to the ink tank and which has the through-holes through which the pressure chambers are communicated with the nozzle openings and the reservoir is communicated with the pressure chambers, the second spacer member having the reservoir and the through-holes through which the pressure chambers are communicated with the nozzle openings, and the nozzle plate member with the nozzle openings, these members being joined together in such a manner that the ink supplying member is placed on one surface of the second spacer member, and the nozzle plate member is fixedly placed on the other surface. The outer surface of the lid member is joined to the outer surface of the ink supplying member with a macromolecular adhesive agent. That is, the pressure generating unit for producing pressure to jet ink droplets is formed by firing the members made of ceramic. Therefore, the pressure generating unit is advantageous in that it has a very good liquid tightness, and the signal applying electrodes can be installed directly thereon. On the other hand, the flow path unit having a relatively large recess to form the reservoir is made of metal, and thus is high in rigidity. In addition, the ceramic pressure generating unit and the metal flow path unit are joined together with a macromolecular adhesive agent relatively high in elasticity. Hence, bending of these units due to the difference in thermal expansion is positively prevented. As a result, the ink jet type recording head of the invention can be made relatively small in thickness, and it is high in reliability.

What is claimed is:

1. A multi-layer ink jet type recording head comprising:
    a pressure generating unit comprising a plurality of pressure chambers and actuator means for increasing pressure in said pressure chambers;
    a flow path unit comprising:
        a nozzle plate member having nozzle openings formed therein;
        an ink supplying member to which ink is supplied from an ink supply inlet member to which said ink supplying member is directly connected, said ink supply inlet member extending in a direction perpendicular to said ink supplying member, said ink supplying member having first through-holes formed therein through which said pressure chambers are communicated with said nozzle openings; and
        a spacer member having a reservoir and second through-holes through which said pressure chambers are communicated with said nozzle openings, wherein said reservoir is communicated with said pressure chambers;
        wherein said pressure chambers are communicated with said nozzle openings via said first through-holes in said ink supplying member, and through said second through-holes in said spacer member;
        said ink supplying member, said spacer member and said nozzle plate member being integrally connected to one another in such a manner that said ink supplying member is placed on one surface of said spacer member and said nozzle plate member is fixedly placed on the other surface of said spacer member; and
    an adhesive agent integrally joining an outer surface of said pressure generating unit to an outer surface of said ink supplying member.

2. The multi-layer ink jet recording head as claimed in claim 1, wherein said first through-holes of said ink supplying member and said second through-holes of said spacer member, through which said pressure chambers are communicated with said nozzle openings, are reduced in diameter towards said nozzle openings.

3. The multi-layer ink jet recording head as claimed in claim 1, wherein said adhesive is a macromolecular adhesive.

4. The multi-layer ink jet type recording head according to claim 1, wherein an area of said flow path unit is larger than an area of said pressure generating unit.

5. The multi-layer ink jet type recording head according to claim 1, wherein said flow path unit is formed by thermally bonding under pressure said ink supplying member, said spacer member and said nozzle plate member and bonding films in such a manner that said bonding films do not cover said first through-holes of said ink supplying member and said second through-holes of said spacer member.

6. The multi-layer ink jet type recording head according to claim 1, wherein said ink supplying member is made of metal.

7. The multi-layer ink jet type recording head according to claim 1, wherein said reservoir is a single, continuous, V-shaped ink reservoir.

8. A multi-layer ink jet type recording head comprising:
 a pressure generating unit comprising a plurality of pressure chambers and actuator means for increasing pressure in said pressure chambers;
 a flow path unit, connected to said pressure generating unit, comprising:
  a nozzle plate member having nozzle openings formed therein;
  an ink supplying member, said ink supplying member having an ink supplying inlet member and having first through-holes formed therein through which said pressure chambers are communicated with said nozzle openings and a reservoir is communicated with said pressure chambers, said ink supplying inlet member being directly connected to said ink supplying member, and said ink supplying inlet member extending in a direction perpendicular to said ink supplying member; and
  a spacer member, said spacer member having said reservoir and second through-holes through which said pressure chambers are communicated with said nozzle openings;
  wherein said pressure chambers are communicated with said nozzle openings via said first through-holes in said ink supplying member and said second through-holes in said spacer member;
  said ink supplying member, said spacer member and said nozzle plate member being integrally connected to one another in such a manner that said ink supplying member is placed on one surface of said spacer member and said nozzle plate member is fixedly placed on the other surface of said spacer member.

9. The multi-layer ink jet type recording head according to claim 8, wherein an area of said flow path unit is larger than an area of said pressure generating unit.

10. The multi-layer ink jet type recording head according to claim 8, wherein said flow path unit is formed by thermally bonding under pressure said ink supplying member, said spacer member and said nozzle plate member and bonding films in such a manner that said bonding films do not cover said through-holes of said ink supplying member and said through-holes of said spacer member.

11. The multi-layer ink jet type recording head according to claim 8, wherein said ink supplying member, said spacer member, and said nozzle plate member are made of metal.

12. The multi-layer ink jet type recording head according to claim 8, wherein said reservoir is a single, continuous, V-shaped ink reservoir.

13. An ink jet recording head comprising:

thin plate members;

an ink supply inlet member;

an ink supply section, formed in a first one of said thin plate members, including a single, continuous, V-shaped ink reservoir, wherein said ink supply inlet member is communicated with said single, continuous, V-shaped ink reservoir and extends in a direction perpendicular to a plane defined by said single, continuous, V-shaped ink reservoir, such that an ink flows unimpeded from said ink supply inlet member to said single, continuous, V-shaped ink reservoir;

nozzle openings, formed in a second one of said thin plate members; and pressure producing chambers, formed in a third one of said thin plate members, respectively corresponding to said nozzle openings;

each of said thin plate members having a plurality of holes therein, said holes in said ink supply section being arranged at an inner portion of said single, continuous, V-shaped ink reservoir, said thin plate members being laminated together so that said holes formed in adjacent ones of said thin plate members are aligned with each other to form a plurality of ink flow paths continuously extending from each of said nozzle openings to said respective pressure producing chambers, wherein said pressure producing chambers communicate with said single, continuous, V-shaped ink reservoir;

wherein an area of any given hole of said plurality of holes forming said ink flow paths is not larger than the area of any others of said holes formed in any of said thin plate members disposed relatively closer to said pressure producing chambers than said thin plate member having said any given hole.

14. An ink jet recording head comprising:

thin plate members;

an ink supply inlet member;

an ink supply section, formed in a first one of said thin plate members, including a single, continuous, V-shaped ink reservoir, wherein said ink supply inlet member is communicated with said single, continuous, V-shaped ink reservoir and extends in a direction perpendicular to a plane defined by said single, continuous, V-shaped ink reservoir, such that an ink flows unimpeded from said ink supply inlet member to said single, continuous, V-shaped ink reservoir;

nozzle openings, formed in a second one of said thin plate members; and pressure producing chambers, formed in a third one of said thin plate members, respectively corresponding to said nozzle openings, each of said thin plate members comprising a plurality of holes therein, said holes in said ink supply section being arranged at an inner portion of said single, continuous, V-shaped ink reservoir, said thin plate members being laminated together so that said holes formed in said thin plate members are arranged along open line to form a plurality of ink flow paths continuously extending from each of said nozzle openings to said respective pressure producing chambers which communicate with said single, continuous, V-shaped ink reservoir.

15. An ink jet head comprising:

a pressure generating unit including a plurality of ink chambers defined by side walls, a vibrating plate defining one wall surface of said ink chambers, and pressure generating elements provided on said vibrating plate in positions corresponding to said ink chambers; and a flow path unit, connected to said pressure generating unit, including a reservoir chamber, said pressure generating unit being secured to said surface of said flow path unit, said reservoir chamber communicating with said plurality of ink chambers, and nozzle communicating passages for communicating a plurality of nozzles with said plurality of ink chambers, wherein an area of said flow path unit is larger than an area of said pressure generating unit.

16. An ink jet head comprising:

a pressure generating unit including a plurality of ink chambers and pressure generating elements for generating a pressure change in the ink chambers; and a flow path unit, connected to said pressure generating unit, including a reservoir chamber for supplying ink to said ink chambers and nozzle openings, each one of said ink chambers being communicated with said reservoir chamber and with a corresponding one of said nozzle openings for jetting ink, wherein an area of said flow path unit is larger than an area of said pressure generating unit.

* * * * *